United States Patent [19]
Pitot et al.

[11] Patent Number: 6,046,644
[45] Date of Patent: Apr. 4, 2000

[54] PHASE-LOCKED LOOP OSCILLATOR FORMED ENTIRELY OF LOGIC CIRCUITS

[75] Inventors: Christian Pitot, Boulogne Billancourt; Michel Prost, Paris, both of France

[73] Assignee: Sextant Avionique, Velizy Villacoublay, France

[21] Appl. No.: 09/165,094

[22] Filed: Oct. 2, 1998

[30] Foreign Application Priority Data

Oct. 3, 1997 [FR] France .................................... 97 12345

[51] Int. Cl.[7] ............................. H03B 5/02; H03L 7/085; H03L 7/099
[52] U.S. Cl. ............................. 331/1 A; 331/17; 331/27; 331/34; 331/57
[58] Field of Search ............................. 331/1 A, 17, 25, 331/27, 34, 57

[56] References Cited

U.S. PATENT DOCUMENTS 5,075,640 12/1991 Miyazawa .................................. 331/10
5,257,294 10/1993 Pinto et al. ............................. 331/1 A
5,442,324 8/1995 Brauns ...................................... 331/34

FOREIGN PATENT DOCUMENTS 0 528 283 A2  2/1993  European Pat. Off. .
2 310 772  9/1997  United Kingdom .

Primary Examiner—Siegfried H. Grimm
Attorney, Agent, or Firm—Oblon, Spivak, McClelland, Maier & Neustadt, P.C.

[57] ABSTRACT

Phase-locked loop oscillators that are designed to set the clock rate of electronic circuits based on combinations of logic circuits and to be integrated, at the same time as these electronic circuits, into one and the same chip. There is proposed a phase-locked loop oscillator based purely on combinations of logic circuits so as not to make use of integration techniques different from those used for the electronic circuits based on combinations of logic circuits, for which they are designed to set the clock rate.

10 Claims, 4 Drawing Sheets

PHASE-LOCKED LOOP OSCILLATOR FORMED ENTIRELY OF LOGIC CIRCUITS

BACKGROUND OF THE INVENTION

1. Field of the Invention

The present invention relates to phase-locked loop oscillators and especially to those designed to generate the clock signals of an electronic circuit made on an integrated circuit chip.

The performance characteristics obtained today by integration techniques enable the integration, on an integrated circuit chip, of electronic circuits based on complex combinations of logic circuits performing sequences of operations at very high rates, known as clock rates. These clock rates can no longer be distributed synchronously on printed circuit boards. This is because the time taken by the clock signals to travel from a single location to different locations of the integrated circuit chips and the dispersion between these travelling times are no longer negligible as compared with the period of these signals. This impossibility of achieving a synchronous distribution, on printed circuit boards, of the very high clock rates required by the electronic circuits integrated chips raises a problem when it is sought to synchronize various electronic circuits integrated into various chips distributed on one or more printed circuit boards.

2. Description of the Prior Art

To resolve this problem, there are known ways for the distribution, on the printed circuit board or boards, of a synchronization signal that is a sub-multiple of the clock signals of the electronic circuits integrated into the chips and for the integration, at the periphery of each chip, of a phase-locked loop oscillator generating the clock signal proper of the electronic circuit integrated into the chip considered. This clock signal is phase-locked with the synchronization signal and has a rate that is a multiple of this signal and is adapted to the performance characteristics of the electronic circuit integrated into the chip.

The technique of the integration of electronic circuits based on logic circuits is evolving very rapidly. Various integration technologies, which are often mutually incompatible, are sharing the market at any given time. Some are becoming obsolete while others are emerging in the course of time so much so that it is not rare, in order to ensure the permanence of an electronic circuit based on logic circuits integrated into a chip, to have to change the integration technology.

This changing of the integration technology does not raise any particular problems for an electronic circuit based on logic circuits inasmuch as, for each integration technology, it is the common practice to develop libraries of logic circuits which only need to be drawn upon in order to obtain integration in an efficient way. Furthermore, the connection pads that are dedicated to them on the periphery of a chip are not specialized. This means that it is always possible to retrieve the same pin arrangement for a component whether it is made with one integration technology or another. This is not the case when the circuits that are integrated into a chip are not limited to a combination of logic circuits but comprise other elements that draw upon specific integration techniques of the technology used, as is the case at present with phase-locked loop oscillators integrated into the periphery of the chips to provide a clock signal. Indeed, it is then difficult to keep the same electrical characteristics for such elements during a change in integration technology. Furthermore, there often rises a problem of the arrangement of the peripheral connection pads as these pads, in most cases, are specialized and have positions that vary with the integration technologies.

Phase-locked loop oscillators however are very useful for the obtaining, with fast technologies, of behavior whose temporal characteristics were obtained hitherto by means of the relative slowness of earlier technologies.

The present situation therefore is one in which the phase-locked loop oscillators form an obstacle to changes in integration technologies which, furthermore, are indispensable to ensuring the permanence of an electronic circuit based on combinations of logic circuits integrated into a chip.

The present invention is aimed at providing a phase-locked loop oscillator whose design facilitates changes in integration technology. To do this, it is proposed to design a phase-locked loop oscillator solely by means of logic circuits so that its integration draws solely upon libraries of logic circuits.

SUMMARY OF THE INVENTION

An object of the invention is a phase-locked loop oscillator comprising:

an oscillator circuit comprising two programmable-delay transition propagation circuits, based on cascades of logic gates with intermediate connectors and on multiplexers, with one data input, one setting input and one data output, looped by means of two D type logic flip-flop circuits with a data input D set at the logic level 1, a clock input CK, a zero-setting R input, a one-setting S input and a data output Q, each programmable-delay transition propagation circuit controlling, by its data output, the clock input CK of one of the D type logic flip-flop circuits and the zero-setting R input of the other D type logic flip-flop circuit, and each D type logic gate controlling, by its data output Q, the data input of the programmable-delay transition propagation circuit controlling its zero-setting R input and a two-input "AND" type logic gate interposed between the data output Q of one of the D type flip-flop circuits and the input of the programmable-delay circuit that is connected to it so as to constitute an inhibition command and oscillation activation input, two up/down counters based on combinations of logic circuits providing for the control of the setting inputs of the two programmable-delay transition propagation circuits, a divider circuit based on combinations of logic circuits connected, at the output of the oscillator circuit, to the data output Q of one of the D type logic flip-flop circuits, a phase comparator circuit based on combinations of logic circuits that receives, at input, the oscillator signal after division by the divider circuit and a phase reference signal, and detects the phase shift between these two signals, and a decision circuit, based on combinations of logic circuits, that is controlled by the phase comparator circuit and prepares the commands of the up/down counter circuits providing for the control of the setting inputs of the programmable-delay transition propagation circuits as a function of the state of phase shift detected by the phase comparator circuit.

Through the fact that the constitution of all the circuits comprising the phase-locked loop oscillator is based exclusively on logic circuits, this phase-locked loop oscillator may be integrated into a chip of prediffused or precharacterized circuits on the same basis as the electronic circuits based on combinations of logic circuits for which it is designed to set the clock signal rate. In this way, it is no longer necessary, in the integration of a phase-locked loop oscillator, to draw upon a particular and specific technique of the integration technology used. Thus, the integration of the phase-locked loop oscillator is prevented from being an obstacle to the inevitable changes in integration technology.

BRIEF DESCRIPTION OF THE DRAWINGS

Other characteristics and advantages of the invention shall appear from the following description of an embodiment given by way of an example. This description shall be made with reference to the appended drawings, of which.

MORE DETAILED DESCRIPTION

Figure 1:
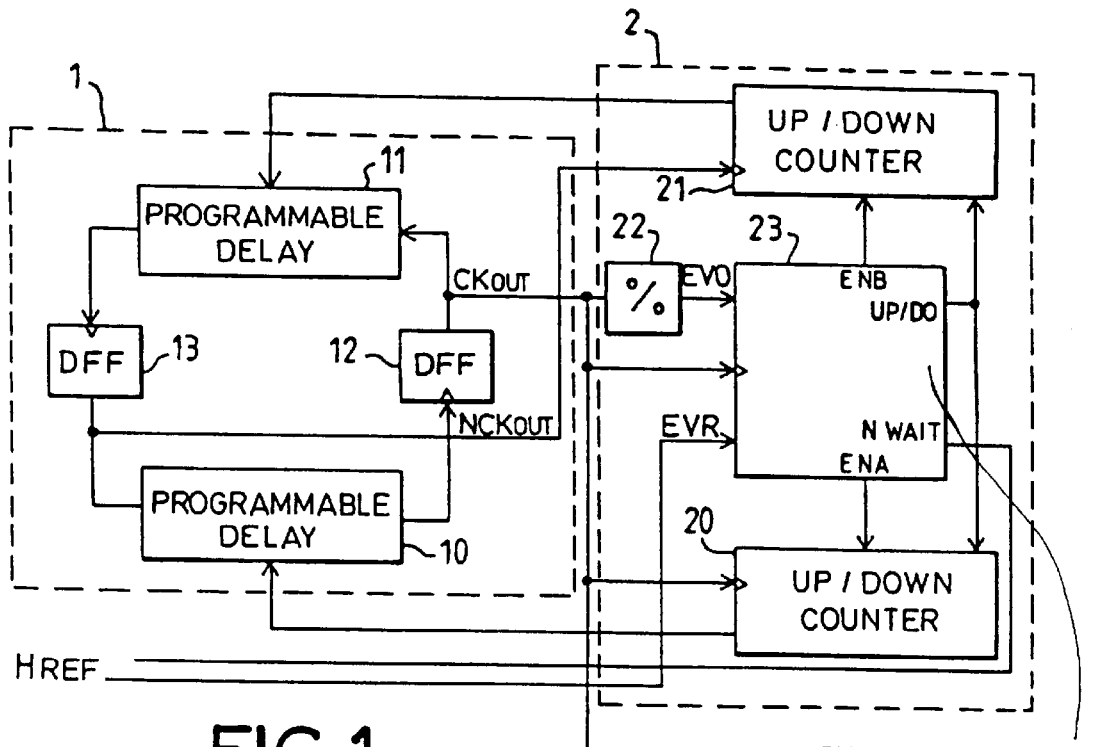
FIG. 1 is a block diagram of a phase-locked loop oscillator according to the invention, FIG. 2 provides a detailed description of the constitution of the oscillator part of the drawing of FIG. 1, FIG. 3 provides a detailed view of the constitution of programmable-delay transition propagation circuits appearing in the drawings of the above figures.

As can be seen in FIG. 1, the phase-locked loop oscillator consists of a frequency-tunable oscillator 1 made solely by means of logic circuits. This oscillator 1 is associated with a phase servo-control loop 2 also made solely by means of logic circuits.

The oscillator 1 delivers a clock signal CKOUT. The phase-locked loop 2 receives the signal CKOUT coming from the oscillator 1, divides it in frequency, compares it in phase with a reference signal HREF and then uses the result of the phase comparison to adjust the frequency of the oscillator 1.

Figure 2:
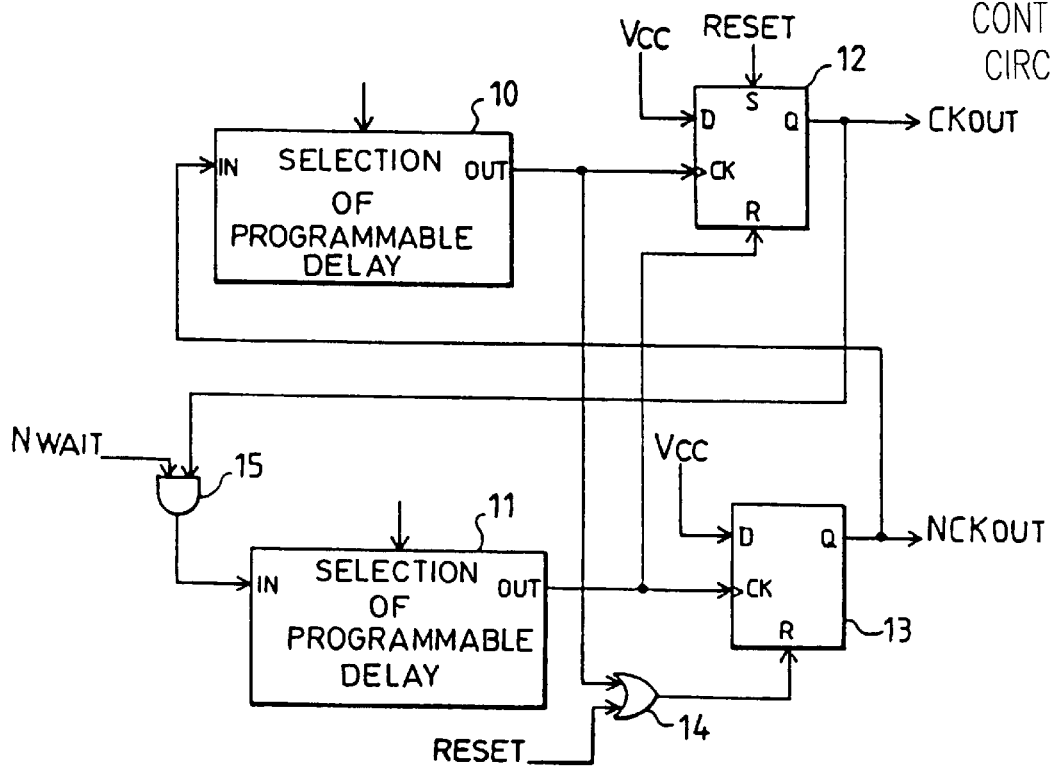

The frequency tunable oscillator 1 essentially has two programmable-delay transition propagation circuits 10, 11 looped together by means of two D type logic flip-flop circuits 12, 13. This oscillator 1 shall be described here below with reference to FIG. 2.

The phase-locked loop 2 consists chiefly of:

two up/down counters 20, 21 that deliver the values of the delays of the two programmable-delay transition propagation circuits 10, 11 of the oscillator 1 and have their clock rates set alternately, one by the output signal CKOUT of the oscillator 1 and the other by the reverse NCKOUT of the output signal of the oscillator, so as to change state only when the transition propagation circuit to which they give a delay-setting value is at rest, a frequency divider 22 taking the frequency of the output signal CKOUT of the oscillator 1 to the vicinity of the frequency of the reference signal HREF, and a circuit 23 for phase comparison and for the control of the up/down counters 20, 21.

The two programmable-delay transition propagation circuits 10, 11 of the oscillator 1 are identical. As can be seen more specifically in FIG. 2, each of them has a data input "in", a data output "out" and an input for setting their delay designated as "selection". Each of them, 10 and 11 respectively, is connected by its data output to the clock input CK of one of the D type flip-flop circuits 12 and 13 respectively, and to the zero-setting R input of the other D type flip-flop circuit 13 and 12 respectively, while their data input is connected to the data output Q of the D type flip-flop circuit whose zero-setting R input they control.

Each programmable-delay transition propagation circuit 10 and 11 respectively conveys one type of logic transition with a certain delay. This is the type of logic transition to which the clock input of the D type flip-flop circuit 12, 13 respectively, to which it is connected by its data output, is sensitive.

The other type of logic transition only reinitializes it. During oscillation, the two D type flip-flop circuits 12, 13 are in opposite states that get exchanged. When starting up, these opposite states are imposed by placing the D type flip-flop circuit 12 at the logic level 1 by a command of an appropriate level at its one-setting S input and by placing the D type flip-flop circuit 13 at the logic level 0 by a command at an appropriate level at its zero-setting R input introduced by means of an "OR" type logic gate 14 interposed in the path of the command coming from the output of the programmable-delay transition propagation circuit 10. These opposite states are not enough to create the instability necessary to start the oscillation. This instability is prompted by the application of a transition to the data input of the programmable-delay transition propagation circuit 11 by means of an "AND" type logic gate 15 interposed in the path of the command coming from the data output Q of the D type flip-flop circuit 12.

This particular oscillator structure is used to prevent the development of parasitic harmonic oscillations. The programmable-delay transition propagation circuits 10, 11 are active alternately. When they are active, they propagate, with a delay, the type of logic transition to which the clock inputs CK of the D type flip-flop circuits 12, 13 are sensitive and then go into a resting state in transmitting, without delay, the other type of logic transition that is applied to them following the zero-setting of the D type flip-flop circuit that controls their data input. Thus, during oscillation, in the loop formed by the two programmable-delay transition propagation circuits 10, 11 and the two D type flip-flop circuits 12 and 13, there circulates only one transition of the type to which the clock inputs CK of the D type flip-flop circuits are sensitive. This transition prompts the passage, to the logic level 1, of the output signal of the oscillator taken at the data output Q of the D type flip-flop circuit 12 whenever it reaches the output of the programmable-delay transition propagation circuit 10 and the passage, to the logic level 0, of the output signal of the oscillator whenever it reaches the output of the programmable-delay transition propagation circuit 11.

Figure 3:
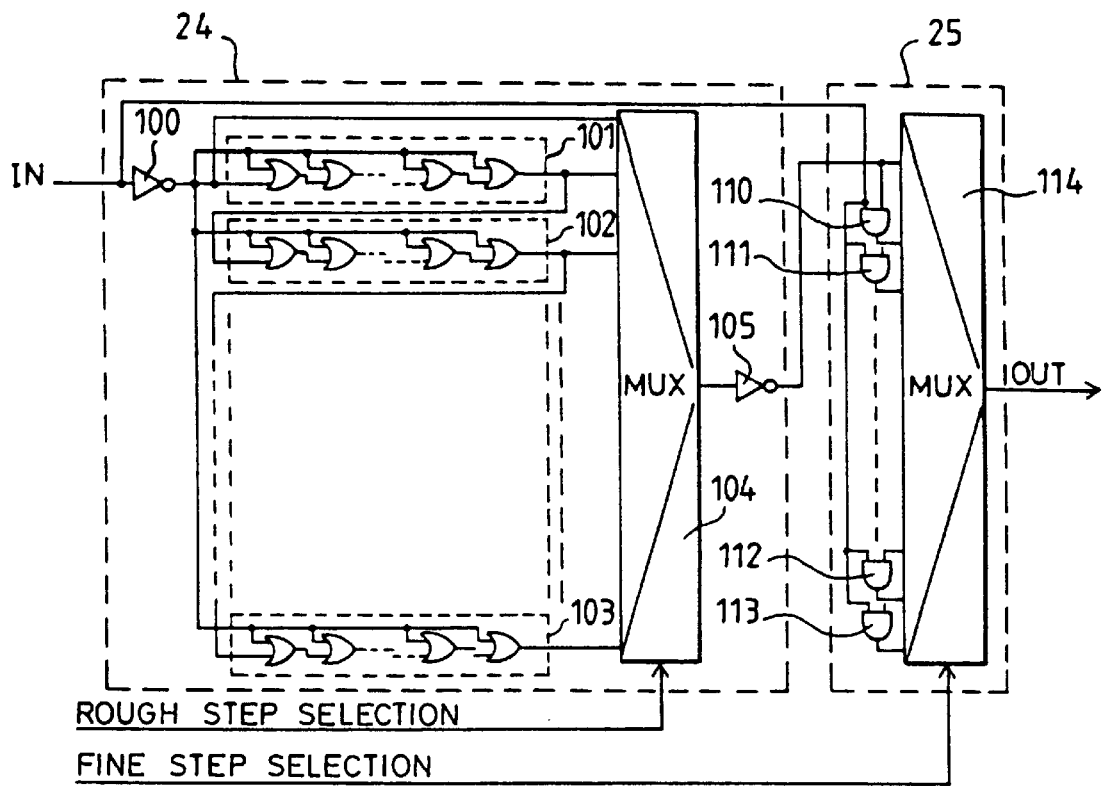

FIG. 3 provides a detailed view of the composition, based on logic gates and multiplexers, of each of the programmable-delay transition propagation circuits. It is assumed here that the transition to be delayed is a rising transition. Each programmable-delay transition propagation circuit is formed by two stages 24 and 25 of delay devices working in series with respect to each other, and each having a different delay setting step.

The first delay device stage 24 comprises:

an inverter amplifier 100 placed at input, a cascade of "OR" type two-input logic gates series-connected by one input and parallel-connected by the other input, placed after the input inverter amplifier 100 and assembled in N groups of equal length 101, 102, . . . , 103, a multiplexer 104 with N+1 inputs connected to the output of the inverter amplifier 100 and to the outputs of the N groups of gates 101, 102, . . . , 103 enabling the extraction of a descending transition that propagates along the cascade of gates when it passes by the input or output of any one of the groups of gates, and an output inverter amplifier 105.

The parallel access to all the "OR" type logic gates makes it possible rapidly, in the resting state, to fix the outputs of all the groups of gates permanently at the logic level 1 through the application of a logic level 0 at input. This ensures that, at rest, there is a stable energy state from which the propagation of a rising transition applied at input could be done in a manner that is reproducible along the other path in which the "OR" type logic gates are series-connected.

The configuration shown here is particularly suited to CMOS technology. The propagation of a rising transition is done through the activity of P type transistors series-connected within "OR" type logic gates. For the same size, these devices are slower than N type transistors owing to the lower mobility of the carriers. This makes it possible to obtain greater propagation times for a smaller surface area. The mode of operation chosen corresponds to the propagation of a descending transition along the "OR" type logic gates. This justifies the presence of the input and output inverter amplifiers 100 and 105.

The second stage of delay devices 25 comprises:

a cascade of M two-input "AND" type logic gates 110, 111, 112, . . . , 113 series-connected by one input and parallel-connected by the other input, and a multiplexer 114 with M+1 inputs connected to the input of the cascade of M "AND" type logic gates 110, 111, 112, . . . , 113 and to the outputs of the M "AND" type logic gates 110, 111, 112, . . . , 113 enabling the extraction of a rising transition that propagates along the cascade of "AND" type logic gates at its passage to the input or to the output of any one of the logic gates.

As in the first delay device stage, the parallel access to all the logic gates enables their output state at rest, in this case the logic state 0, to be rapidly fixed in a permanent state so as to ensure that, at rest, there is a stable energy state from which the propagation of a rising transition applied to the input could be done in a reproducible way along the other path in which the gates are series-connected.

In this example suited to CMOS technology, the second stage of delay devices is obtained with "AND" type logic gates so as to obtain a smaller elementary delay.

The two stages of delay devices are sized so as to obtain a range of delays that is wider than the dynamic range of possible variations of delay due to the intrinsic dispersion of the technological parameters and due to the ranges of temperature and supply voltage in which the circuit must be capable of working.

Figure 4:
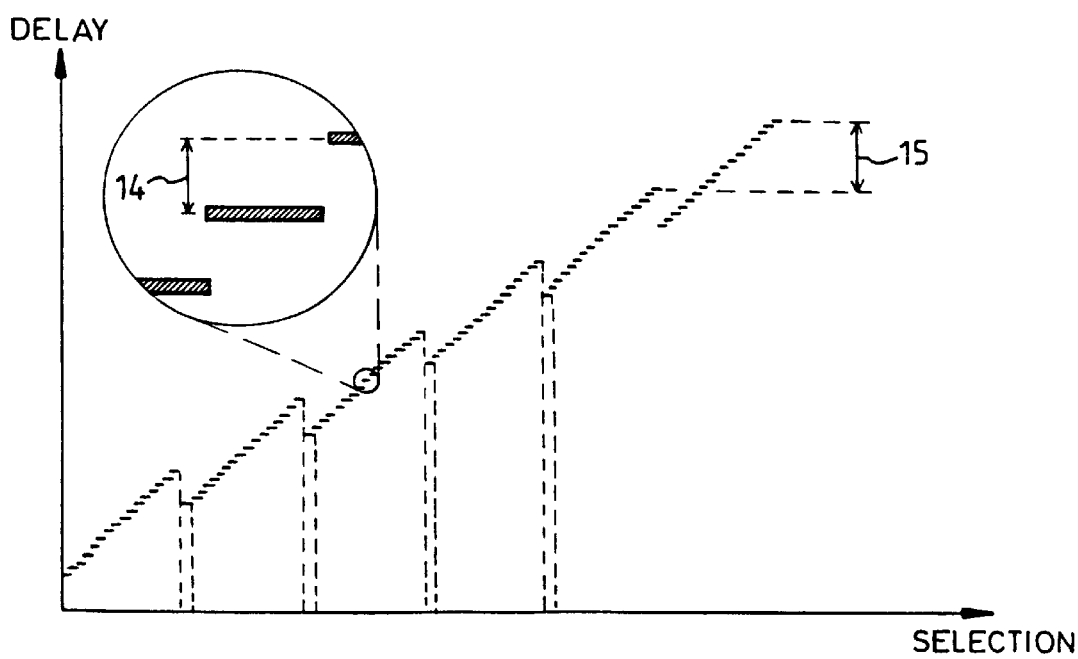
FIG. 4 is a graph illustrating the setting with two scales, one rough and the other fine, of the delay periods of the programmable-delay transition propagation circuits, FIG. 5 provides a detailed view of the constitution of the phase servo-control circuit appearing in the drawing of FIG. 1, FIG. 6 provides a detailed view of the constitution of the phase comparator forming part of the phase servo-control circuit shown in the above figure, and FIG. 7 provides a detailed view of the constitution of a decision circuit placed after the phase comparator in the phase servo-control circuit of FIG. 5.

As can be seen in the graph of FIG. 4, the groups of gates of the first stage of delay devices are sized approximately so as to have a unit delay smaller than the delay-setting dynamic range of the second stage of delay devices. This is done so that the movements of the point of equilibrium of the phase servo-control loop due to the phase measurement noise alone causes only a modification of the addressing of the multiplexer of the second stage. This precaution makes it possible, once the oscillator has been locked into, to set up a servo-control over its frequency and phase operation by playing solely on the steps for the fine-setting of the delay, thus minimizing the jitter related to the functioning of the servo-control.

In the graph of FIG. 4, it has been assumed that there is a two-stage programmable-delay transition propagation circuit having sixteen unit steps 14 for the fine-setting of the delay whose selection is made on four bits and unit steps 15 for the rough-setting of the delay that are smaller in duration than the full range of the fine-setting unit steps 14.

The changes in setting of the delays of the transition propagation circuits 10, 11 are done only when these circuits are in a resting position, namely when they do not convey any rising transition. This is obtained by making each up/down counter 20, 21 respectively (FIG. 1) work during the resting period of the transition propagation circuit 10, 11 respectively whose delay it governs. To do this, the up/down counters 20, 21 which are assumed to be sensitive to a rising clock transition receive, as clock signals, versions of the oscillator output signal that are in phase opposition, namely the version CKOUT for the up/down counter 20 and the version NCKOUT for the up/down counter 21. These up/down counters 20, 21 are controlled by enabling signals ENA, ENB and an up/down counting signal UP/DO delivered by the phase comparison and control circuit 23.

Figure 5:
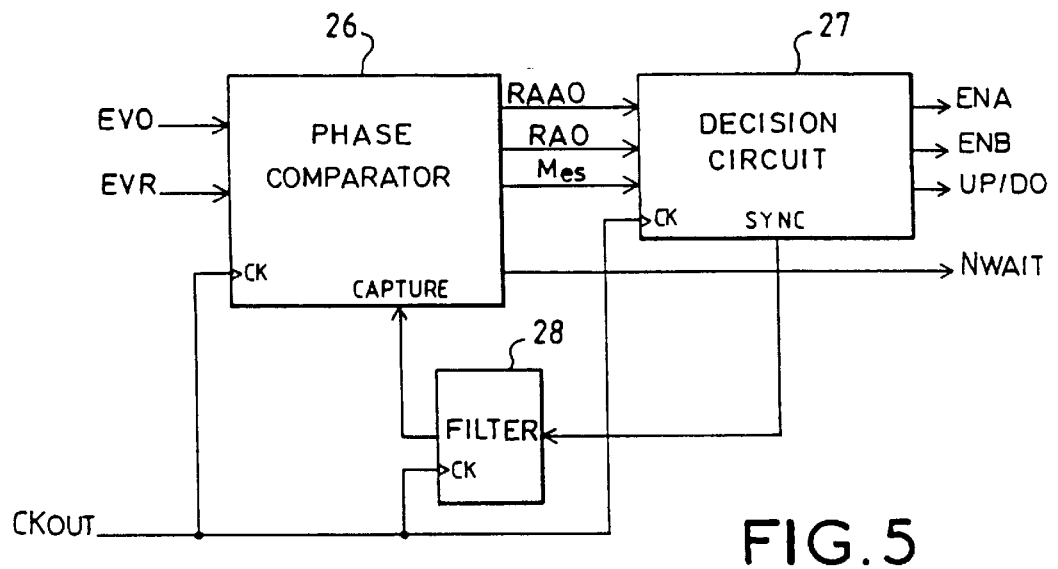

FIG. 5 shows the constitution of the phase comparison and control circuit 23. This circuit can be analyzed as being constituted by three logic circuits whose clock rate is set by the output signal CKOUT of the oscillator:

a phase comparator circuit 26 carrying out measurements of relative positions of the rising transitions in the frequency-divided output signal EVO of the oscillator and a reference signal EVR corresponding to the signal HREF (FIG. 1) and delivering a measurement signal Mes, two signals for the comparison of the relative positions of the rising transitions of the measured signals RAAO and RAO and a capture activation signal NWAIT, a decision circuit 27 placed after the phase comparator 26 and preparing the enabling signals ENA, ENB and the counting direction signals UP/DO designed for the up/down counters 20, 21 and a synchronization test signal SYNC, and a filtering circuit 28 working on the synchronization test signal generated by the decision circuit 27 before returning it as a capture signal to the phase comparator 26.

Figure 6:
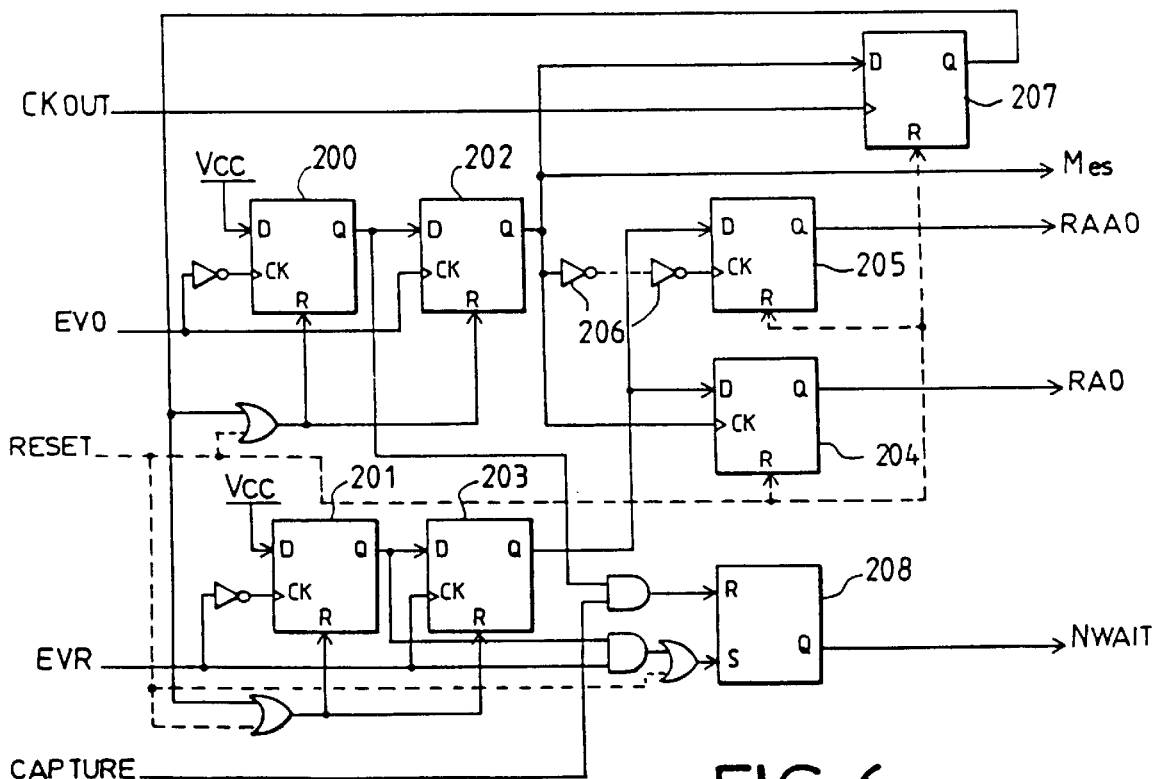

A drawing of the phase comparator circuit 26 designed to detect the phase relationships between the rising transitions of the divided signal EVO coming from the oscillator and of the reference signal EVR, which are the active transitions in the exemplary embodiment described in detail herein, is given in FIG. 6. With this drawing of a phase comparator circuit, the detection of the phase relationships is done in four steps of which the first three correspond to three stages of successive D type logic flip-flop circuits.

The first step takes place independently for the two signals EVO and EVR. It consists in waiting for and memorizing the appearance of a descending transition in each of the signals EVO and EVR by means of a first stage of D type logic flip-flop circuits, the D type logic flip-flop circuit 200 for the signal EVO and the D type logic flip-flop circuit 201 for the signal EVR.

The second step, which takes place also independently for the two signals EVO and EVR, consists of the subsequent detection of a rising transition in each of the signals EVO and EVR. It is obtained by means of a second stage of D type logic flip-flop circuits, namely the D type logic flip-flop circuit 202 for the signal EVO and the D type logic flip-flop circuit 203 for the signal EVR. Each rising transition of the divided signal EVO coming from the oscillator activates a phase comparison measurement that is reported to the decision circuit 27 by a signal Mes generated by the D type logic flip-flop circuit 202.

The third step, which is the phase comparison step proper, uses a third stage of D type logic flip-flop circuits, namely the D type logic flip-flop circuits 204 and 205. The first D type flip-flop circuit 204 samples the logic level of the reference signal EVR on the appearance of a rising transition of the divided signal EVO coming from the oscillator and delivers a signal RAO. The second D type logic flip-flop circuit 205 samples the logic level of the reference signal EVR with a certain delay with respect to the first one and delivers a signal RAAO. The delay of the sampling time of the second flip-flop circuit 205 with respect to the first flip-flop circuit 204 is sized to prevent the possibility that the flip-flop circuits 204, 205 may be both located in a situation of indeterminacy (a metastable state). This delay is obtained by the interposing, before the clock input of the second flip-flop circuit 205, of a certain number of logic layers 206. At the end of the comparison stage, three situations are possible:

the two flip-flop circuits 204 and 205 are both at the logic level 1. It is deduced therefrom that the rising transition of the reference signal EVR is prior to that of the divided signal EVO coming from the oscillator.

The two flip-flop circuits 204 and 205 are both at the logic level 0. It is deduced therefrom that the rising transition of the reference signal EVR is subsequent to that of the divided signal EVO coming from the oscillator.

The two flip-flop circuits 204 and 205 have antagonistic states, the flip-flop circuit 204 being at the logic level 0 and the flip-flop circuit 205 being at the logic level 1. It is deduced therefrom that the rising transitions of the reference signal EVR and of the divided signal EVO coming from the oscillator are simultaneous.

At the end of the measurement phase, the phase comparator circuit is reinitialized by means of a D type logic flip-flop circuit 207. The D input of this flip-flop circuit is connected to the Q output of the storage D type flip-flop circuit 202 sampling the rising transitions of the divided signal EVO coming from the oscillator and its clock input CK receives the signal CKOUT of the oscillator.

An RS type logic flip-flop circuit 208 enables the generation of an pending signal NWAIT that is active at the logic level 0. The function of this signal NWAIT is to prolong the resting state of one of the arms of the oscillator, namely the arm that contains the programmable-delay transition propagation circuit 11 and normally starts its active state on a leading edge of the output signal CKOUT of the oscillator. This signal NWAIT is activated in the presence of a capture signal after the appearance of a descending transition in the divided signal EVO coming from the oscillator. It is deactivated by a zero-setting of the phase comparator circuit or the occurrence of a rising transition in the reference signal EVR following a descending transition of this same reference signal.

Figure 7:
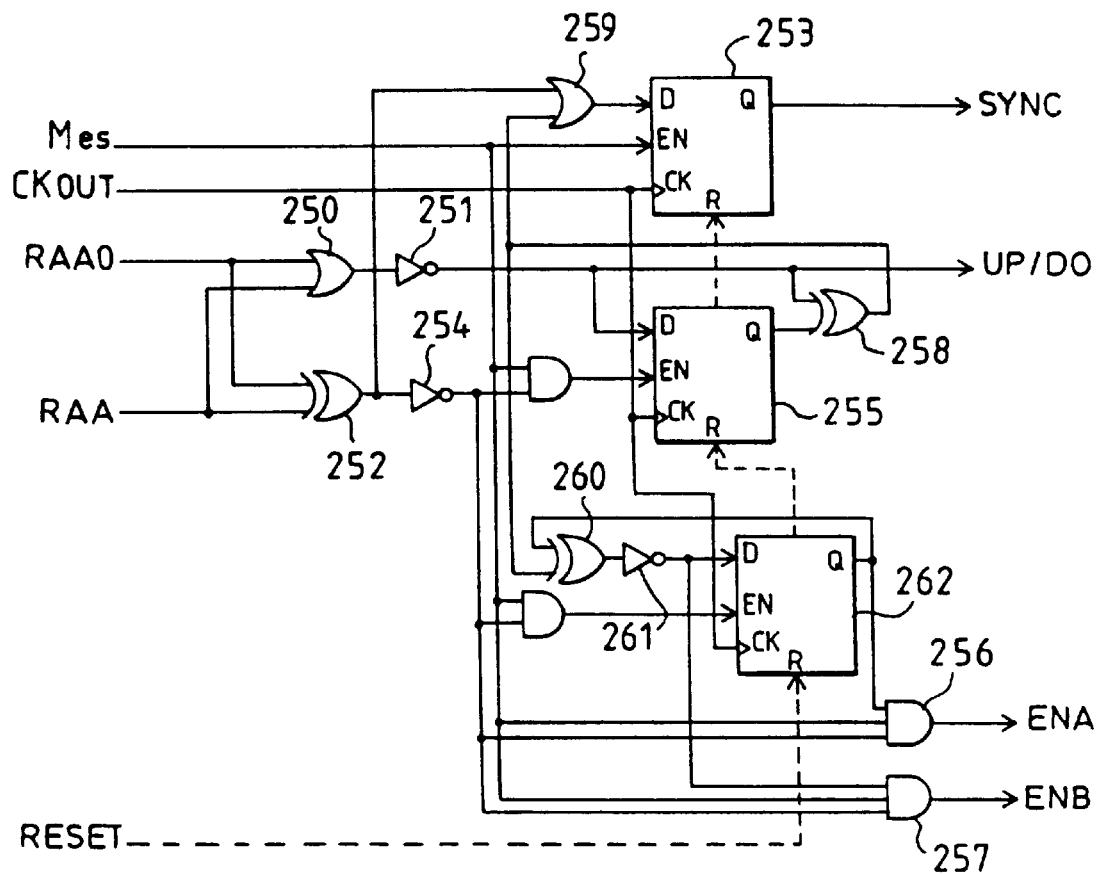

A drawing of a decision circuit 27 is given in FIG. 7. It is designed to implement a decision algorithm based on three rules of operation:

the transmission of a counting up command when the rising transition of the divided signal EVO coming from the oscillator is prior to the rising transition of the reference signal EVR, namely when the signals RAO and RAAO are both at the logic level zero 0, the transmission of a counting down command when the rising transition of the signal EVO coming from the oscillator division is after the rising transition of the reference signal EVR, namely when the signals RAO and RAAO are both at the logic level 1, the absence of a counting up or counting down command in the event of simultaneity of the rising transition of the divided signal EVO coming from the oscillator and of the reference signal EVR, namely when the signals RAO and RAAO are at opposite logic levels, it being known that the setting of the delay should be modified only one oscillator arm at a time and that, if a current counting up or counting down command is of the same nature as the previous one coming from the last significant measurement, then it must be applied to the opposite arm of the oscillator whereas, if the current command is of an opposite nature, it must be applied to the same arm of the oscillator to prevent a drift of a cyclical ratio of the signal coming from the oscillator.

The up/down counting command UP/DO is obtained by means of an "OR" type two-input logic gate 250 that is followed by an inverter amplifier 251 and receives the signals RAO and RAAO at its two inputs.

A first "XOR" type logic gate 252 detects the state of simultaneity of the rising transitions of the signals EVO and EVR corresponding to different logic levels on the signals RAO and RAAO. Its output signal is sampled by a D type logic flip-flop circuit 253 to generate a synchronism detection signal SYNC. It is also used, after having been inverted by an inverter amplifier 254, firstly to turn on a D type logic flip-flop circuit 255 which stores the up/down direction of the last effective correction and, secondly, to turn on the "AND" type logic gates 256, 257 delivering ON commands ENA and ENB designed for the up/down counters 20, 21 (FIG. 1).

A second "XOR" type logic gate 258 detects a change in direction of the up/down counting command UP/DO. Its output signal is applied by means of an "OR" type logic gate 259 to the input D of the D type logic flip-flop circuit 253 so that it also generates a synchronism signal SYNC when two successive up/down counting commands UP/DO are of opposite natures.

A third "XOR" type logic gate 260 followed by an inverter amplifier 261 and combined with a D type logic flip-flop circuit 262 stores the arm of the oscillator on which the last correction has been made. This gate 260 controls the "AND" type logic gates 256, 257 so as to turn one of these two gates on, alternately one after the other, when the current counting up or counting down command UP/DO is of the same nature as the previous command coming from the last significant measurement or so as to turn always the same gate on when the current counting up or counting down command UP/DO is of an opposite nature to the previous command coming from the last significant measurement.

The synchronization signal SYNC available at output of the D type logic flip-flop circuit 253, which reports the capture of the phase-locked loop, is used as a capture signal by the phase comparator circuit (FIG. 6) after having been filtered (filter 28, FIG. 5) in order to eliminate the noise therefrom.

The phase-locked loop oscillator that has just been described makes use only of logic circuits. It can therefore be integrated into a prediffused or precharacterized circuit depending on the usual methods used for the gate combination circuits and logic flip-flop circuits for which the prediffused or precharacterized circuits are more particularly designed. Through this property, it can be transposed from one integration technology to another, on the same basis as the circuits for the combination of gates and logic flip-flop circuits, without raising specific problems other than that of the matching of the delay lines to the speed of the target technology and to the frequencies sought for the operation of the oscillator.

What is claimed is:

1. A phase-locked loop oscillator comprising:
    an oscillator circuit comprising two programmable-delay transition propagation circuits, based on cascades of logic gates with intermediate connectors and on multiplexers, with one data input, one setting input and one data output, looped by means of two D type logic flip-flop circuits with a data input D set at the logic level 1, a clock input CK, a zero-setting R input, a one-setting S input and a data output Q, each programmable-delay transition propagation circuit controlling, by its data output, the clock input CK of one of the D type logic flip-flop circuits and the zero-setting R input of the other D type logic flip-flop circuit, and each D type logic gate controlling, by its data output Q, the data input of the programmable-delay transition propagation circuit controlling its zero-setting R input and a two-input "AND" type logic gate interposed between the data output Q of one of the D type flip-flop circuits and the input of the programmable-delay circuit that is connected to it so as to constitute an inhibition command and oscillation activation input,
    two up/down counters based on combinations of logic circuits providing for the control of the setting inputs of the two programmable-delay transition propagation circuits,
    a divider circuit based on combinations of logic circuits connected, at the output of the oscillator circuit, to the data output Q of one of the D type logic flip-flop circuits,
    a phase comparator circuit based on combinations of logic circuits that receives, at input, the oscillator signal after division by the divider circuit and a phase reference signal, and detects the phase shift between these two signals, and
    a decision circuit, based on combinations of logic circuits, that is controlled by the phase comparator circuit and prepares the commands of the up/down counter circuits providing for the control of the setting inputs of the programmable-delay transition propagation circuits as a function of the state of phase shift detected by the phase comparator circuit.

2. An oscillator according to claim 1, wherein each programmable-delay transition propagation circuit comprises at least one cascade of logic gates with two inputs and one output, series-connected by one input and parallel-connected by the other input, and one multiplexer whose inputs are connected to inputs, outputs and intermediate connectors of said cascade of gates.

3. An oscillator according to claim 2, wherein said cascade is constituted by "OR" type logic gates.

4. An oscillator according to claim 2, wherein said cascade is constituted by "AND" type logic gates.

5. An oscillator according to claim 1, wherein each programmable-delay transition propagation circuit comprises two successive stages of delay devices, a first stage of rough-setting steps and a second stage of fine-setting steps.

6. An oscillator according to claim 5, wherein the amplitude of the range of setting of the delay of the second stage is greater than the value of one rough-setting step of the first stage.

7. An oscillator according to claim 1, with programmable-delay transition propagation circuits adapted to the delayed propagation of rising transitions, wherein each programmable-delay transition propagation circuit comprises:
    an input inverter amplifier,
    a cascade of "OR" type logic gates with two inputs and one output series-connected by one input and parallel-connected by the other input, to the output of the inverter amplifier,
    a multiplexer with multiple inputs and one output, connected by its inputs to inputs, outputs and intermediate connectors of the cascade of "OR" type logic gates, and
    an output inverter amplifier connected to the output of the multiplexer.

8. An oscillator according to claim 1, with programmable-delay transition propagation circuits adapted to the delayed propagation of rising transitions, wherein each programmable-delay transition propagation circuit comprises:
    a cascade of "AND" type logic gates with two inputs and one output series-connected by one input and parallel-connected by the other input, and
    a multiplexer with multiple inputs and one output, connected by its inputs to inputs, outputs and intermediate connectors of the cascade of "AND" type logic gates.

9. An oscillator according to claim 1, with programmable-delay transition propagation circuits adapted to the delayed propagation of rising transitions, wherein each programmable-delay transition propagation circuit comprises two successive stages of delay devices, one of the stages comprising:
    an input inverter amplifier,
    a cascade of "OR" type logic gates with two inputs and one output series-connected by one input and parallel-connected by the other input, to the output of the inverter amplifier,
    a multiplexer with multiple inputs and one output, connected by its inputs to inputs, outputs and intermediate connectors of the cascade of "OR" type logic gates, and
    an output inverter amplifier connected to the output of the multiplexer, and the other stages of delay devices comprising:
    a cascade of "AND" type logic gates with two inputs and one output series-connected by one input and parallel-connected by the other input, and
    a multiplexer with multiple inputs and one output, connected by its inputs to inputs, outputs and intermediate connectors of the cascade of "AND" type logic gates.

10. An oscillator according to claim 1, wherein the phase comparator circuit comprises two D type logic flip-flop circuits evaluating the relative phase of the phase reference signal with respect to the oscillator signal after division, the measurement of one of the D type logic flip-flop circuits being delayed by means of a delay chain that is inserted upline to its clock input and generates a delay whose duration is such that at least one of the two D type flip-flop circuits has a deterministic behavior whatever may be the respective phases of the phase reference signal and of the oscillator signal after division.

* * * * *